United States Patent
Staals

(10) Patent No.: US 11,204,557 B2
(45) Date of Patent: Dec. 21, 2021

(54) METHODS AND PATTERNING DEVICES AND APPARATUSES FOR MEASURING FOCUS PERFORMANCE OF A LITHOGRAPHIC APPARATUS, DEVICE MANUFACTURING METHOD

(71) Applicant: ASML Netherlands B.V., Veldhoven (NL)

(72) Inventor: Frank Staals, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/688,438

(22) Filed: Nov. 19, 2019

(65) Prior Publication Data

US 2020/0159130 A1    May 21, 2020

(30) Foreign Application Priority Data

Nov. 20, 2018  (EP) ................................. 18207326

(51) Int. Cl.
*G03F 7/20* (2006.01)
*G03F 1/44* (2012.01)
*G03F 9/00* (2006.01)

(52) U.S. Cl.
CPC ............ *G03F 7/70641* (2013.01); *G03F 1/44* (2013.01); *G03F 7/70616* (2013.01); *G03F 7/70683* (2013.01); *G03F 9/7076* (2013.01)

(58) Field of Classification Search
CPC .... G03F 1/44; G03F 7/70616; G03F 7/70633; G03F 7/70641; G03F 7/70683;
(Continued)

(56) References Cited

U.S. PATENT DOCUMENTS

2006/0033921 A1    2/2006  Den Boef et al.
2006/0066855 A1    3/2006  Boef et al.
(Continued)

FOREIGN PATENT DOCUMENTS

EP          3 422 102 A1    1/2019
WO    WO 2009/078708 A1    6/2009
(Continued)

OTHER PUBLICATIONS

International Search Report and Written Opinion of the International Searching Authority directed to related International Patent Application No. PCT/EP2019/078087, dated Nov. 22, 2019; 14 pages.

*Primary Examiner* — Colin W Kreutzer
(74) *Attorney, Agent, or Firm* — Sterne, Kessler, Goldstein & Fox P.L.L.C

(57) ABSTRACT

Disclosed is a method of measuring focus performance of a lithographic apparatus. The method comprises using the lithographic apparatus to print at least one focus metrology pattern on a substrate, the printed focus metrology pattern comprising at least a first periodic array of features, and using inspection radiation to measure asymmetry between opposite portions of a diffraction spectrum for the first periodic array in the printed focus metrology pattern. A measurement of focus performance is derived based at least in part on the asymmetry measured. The first periodic array comprises a repeating arrangement of a space region having no features and a pattern region having at least one first feature comprising sub-features projecting from a main body and at least one second feature; and wherein the first feature and second feature are in sufficient proximity to be effectively detected as a single feature during measurement. A patterning device comprising said first periodic array is also disclosed.

15 Claims, 7 Drawing Sheets

(58) Field of Classification Search
CPC .... G03F 9/7026; G03F 9/7069; G03F 9/7073; G03F 9/7076
USPC ..................................... 355/55, 77; 356/624
See application file for complete search history.

(56) References Cited

U.S. PATENT DOCUMENTS

| | | |
|---|---|---|
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2015/0323471 A1* | 11/2015 | Sapiens ............... G01N 21/93 356/73 |
| 2015/0338749 A1* | 11/2015 | Hinnen .................. G03F 1/44 355/55 |
| 2016/0274456 A1 | 9/2016 | Chen et al. |
| 2016/0313656 A1* | 10/2016 | Van Dommelen ........... G03F 7/70641 |
| 2017/0176871 A1* | 6/2017 | Van Buel ............ G03F 7/70683 |
| 2018/0284624 A1* | 10/2018 | Ausschnitt ......... G03F 7/70608 |
| 2019/0137881 A1* | 5/2019 | Ausschnitt ......... G03F 7/70633 |

FOREIGN PATENT DOCUMENTS

| | | |
|---|---|---|
| WO | WO 2009/106279 A1 | 9/2009 |
| WO | WO 2009/130010 A1 | 10/2009 |
| WO | WO 2013/178422 A1 | 12/2013 |
| WO | WO 2015/090839 A1 | 6/2015 |

* cited by examiner

METHODS AND PATTERNING DEVICES AND APPARATUSES FOR MEASURING FOCUS PERFORMANCE OF A LITHOGRAPHIC APPARATUS, DEVICE MANUFACTURING METHOD

FIELD OF THE INVENTION

The present invention relates to inspection apparatus and methods usable, for example, to perform metrology in the manufacture of devices by lithographic techniques. The invention further relates to such methods for monitoring a focus parameter in a lithographic process.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature.

Traditionally, optimal settings were determined by "send-ahead wafers" i.e. substrates that are exposed, developed and measured in advance of a production run. In the send-ahead wafers, test structures were exposed in a so-called focus-energy matrix (FEM) and the best focus and energy (exposure dose) settings were determined from examination of those test structures. More recently, focus metrology targets are included in the production designs, to allow continuous monitoring of focus performance. These metrology targets should permit rapid measurements of focus, to allow fast performance measurement in high-volume manufacturing. Ideally, the metrology targets should be small enough that they can be placed among the product features without undue loss of space.

Current test structure designs and focus measuring methods have a number of drawbacks. Known focus metrology targets require sub-resolution features and/or grating structures with large pitches. Such structures may contravene design rules of the users of lithographic apparatuses. Asymmetry in a grating structure can be measured effectively using high-speed inspection apparatus such as a scatterometer, working at visible radiation wavelengths. Known focus measuring techniques exploit the fact that focus-sensitive asymmetry can be introduced into structures printed in a resist layer by special design of the patterns on a patterning device that defines the target structure. For EUV lithography, where printing is performed using radiation of a wavelength less than 20 nm, for example 13.5 nm, the creation of sub-resolution features becomes even more difficult. For EUV lithography, resist thickness, and therefore the thickness of target structures, is smaller. This weakens the diffraction efficiency, and hence the signal strength, available for focus metrology.

For these reasons, there is a need to develop new techniques for the measurement of focus performance in lithographic processes, particularly in EUV lithography, but also for projection-based lithography in general.

SUMMARY OF THE INVENTION

The present invention aims to provide alternative methods of measuring focus performance. In some aspects the invention aims to provide methods that are adaptable to new environments, such as EUV lithography. In some aspects, the invention aims to avoid the requirement for sub-resolution features to be defined in a patterning device.

In a first aspect of the invention, the inventors have recognized that alternative target designs can be devised, which provide focus-dependent asymmetry signals without the use of sub-resolution features.

The invention in a first aspect provides a method of measuring focus performance of a lithographic apparatus, the method comprising: (a) obtaining measurement data relating to measured asymmetry between opposite portions of a diffraction spectrum for a first periodic array in a printed focus metrology pattern on a substrate; and (b) deriving a measurement of focus performance based at least in part on the asymmetry comprised within the measurement data, wherein said first periodic array comprises a repeating arrangement of a space region having no features and a pattern region having at least one first feature comprising sub-features projecting from a main body and at least one second feature; and wherein the first feature and second feature are in sufficient proximity to be effectively detected as a single feature when measured in a measurement step.

The invention in a second aspect provides a patterning device for use in a lithographic apparatus, the patterning device comprising reflective and non-reflective portions to define features of one or more device patterns and one or more metrology patterns, the metrology patterns including at least one focus metrology pattern, the focus metrology pattern comprising at least a first periodic array of features comprising a repeating arrangement of features arranged to define a space region having no features and a pattern region having at least one first feature comprising sub-features projecting from a main body and at least one second feature; and wherein the first feature and second feature are in sufficient proximity to be effectively detected as a single feature during a scatterometery based metrology action to measure asymmetry between opposite portions of a diffraction spectrum for the first periodic array as formed on a substrate.

The invention yet further provides a lithographic system comprising a lithographic apparatus comprising:
an illumination optical system arranged to illuminate a reflective patterning device;
a projection optical system arranged to project an image of the patterning device onto a substrate; and
a metrology apparatus according to the first aspect of the invention as set forth above,
wherein the lithographic apparatus is arranged to use the measurement of focus performance derived by the metrology apparatus when applying the pattern to further substrates.

The invention yet further provides computer program products for use in implementing methods and apparatuses according to various aspects of the invention as set forth above.

The invention yet further provides a method of manufacturing devices using the method according to the first aspect or the second aspect of the invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
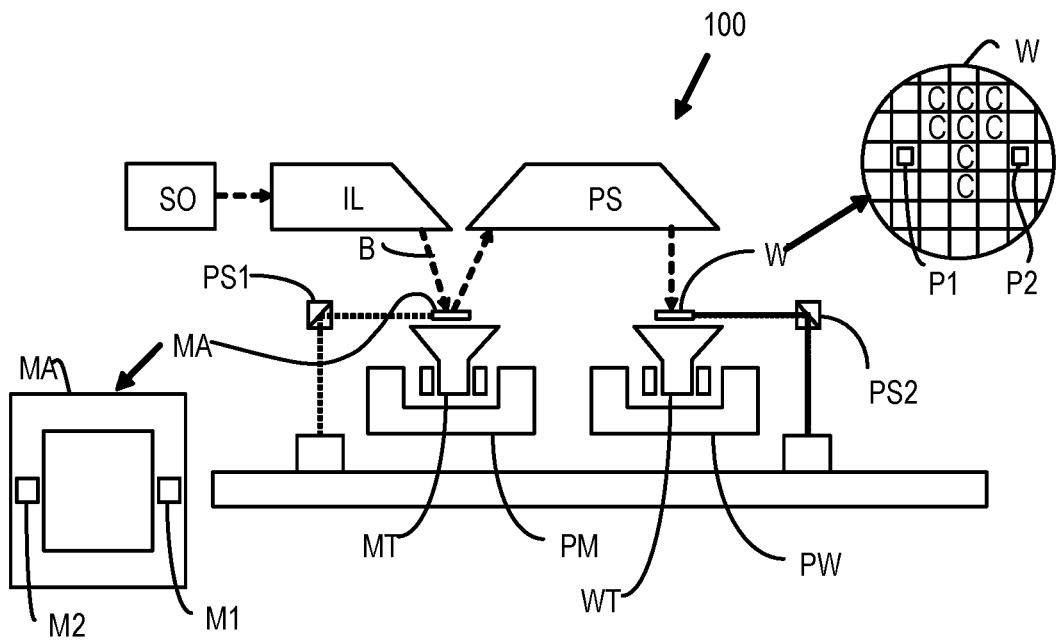
FIG. 1 depicts a lithographic apparatus having a reflective patterning device.

FIG. 1 schematically depicts a lithographic apparatus 100 including a source module SO according to one embodiment of the invention. The apparatus comprises:
an illumination system (illuminator) IL configured to condition a radiation beam B (e.g. EUV radiation).
a support structure (e.g. a mask table) MT constructed to support a patterning device (e.g. a mask or a reticle) MA and connected to a first positioner PM configured to accurately position the patterning device;
a substrate table (e.g. a wafer table) WT constructed to hold a substrate (e.g. a resist-coated wafer) W and connected to a second positioner PW configured to accurately position the substrate; and
a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

In general patterning devices used in lithography may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask). The focus metrology techniques of the present disclosure have been developed particularly for use with reflective patterning devices (reticles), where illumination is not in a direction normal to a plane of the patterning device surface, but at a slightly oblique angle. In principle, the same techniques could apply in relation to a transmissive patterning device, if for some reason illumination introduced asymmetry. Conventionally, illumination of the reticle is designed to be symmetrical, but with reflective reticles, that is not generally possible.

Certain embodiments of the present disclosure exploit asymmetry in the projection system using a reflective patterning device. Other embodiments are applicable with any kind of projection system.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source module. The laser and the source module may be separate entities, for example when a CO2 laser is used to provide the laser beam for fuel excitation.

In such cases, the laser is not considered to form part of the lithographic apparatus and the radiation beam is passed from the laser to the source module with the aid of a beam delivery system comprising, for example, suitable directing mirrors and/or a beam expander. In other cases the source may be an integral part of the source module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It will be understood that the lithographic apparatus is represented in FIG. 1 in a highly schematic form, but that is all that is necessary for the present disclosure.

Figure 2:
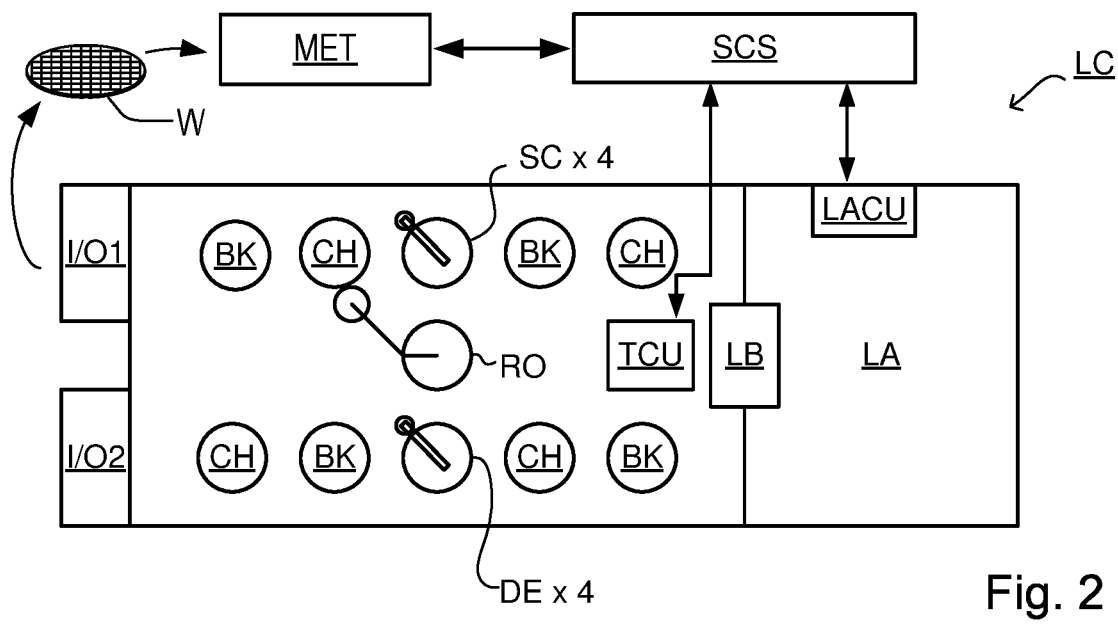
FIG. 2 depicts a lithographic cell or cluster in which a lithographic apparatus and metrology apparatus can be used to perform methods according to the present invention.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/01, I/02, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly, a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3A:
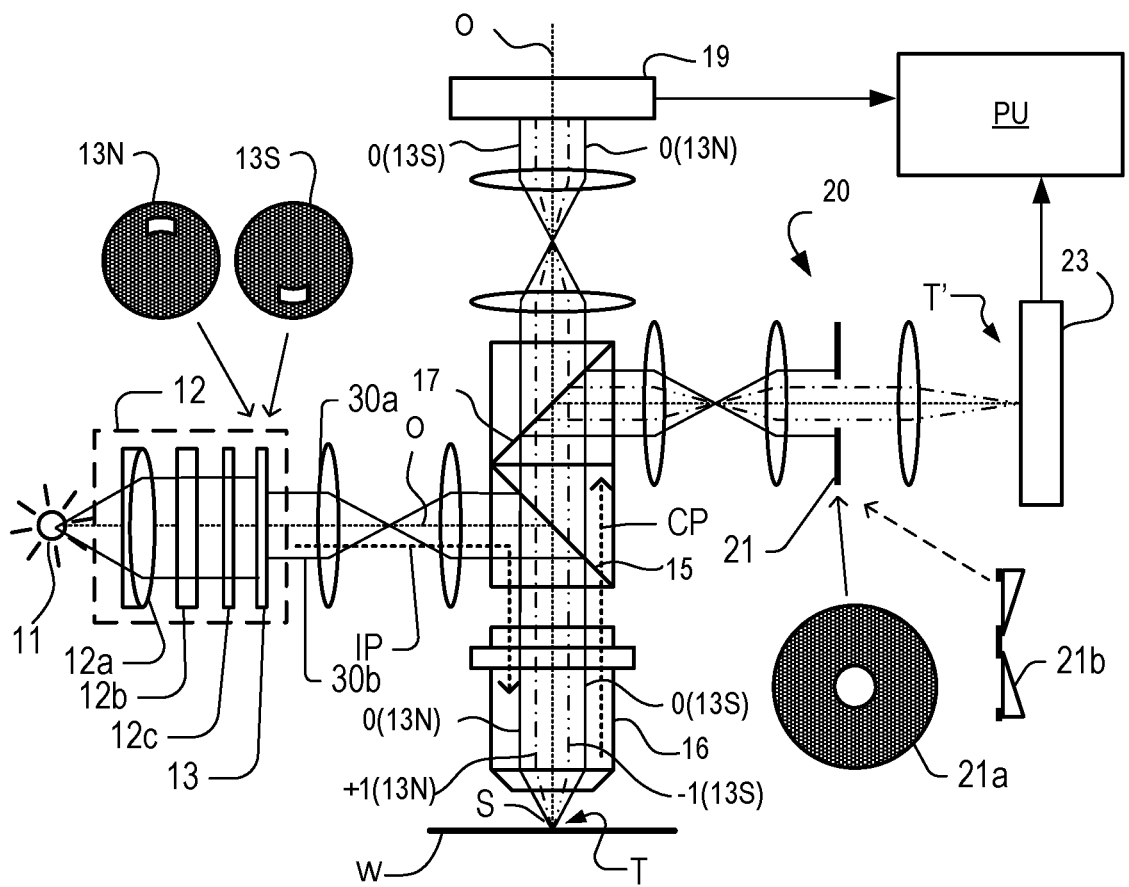
FIGS. 3a and 3b illustrate schematically an inspection apparatus adapted to perform angle-resolved scatterometry and dark-field imaging inspection methods.

FIG. 3(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 3(b).

As described in the prior applications cited in the introduction, the dark-field imaging apparatus of FIG. 3(a) may be part of a multi-purpose angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating lens system, a color filter, a polarizer and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example as a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures mounted on a movable slide or wheel. It may alternatively comprise a programmable spatial light modulator. As a further alternative, optical fibers may be disposed at different location in the illumination pupil plane and used selectively to deliver light or not deliver light at their respective locations. These variants are all discussed and exemplified in the documents cited above.

Figure 3B:
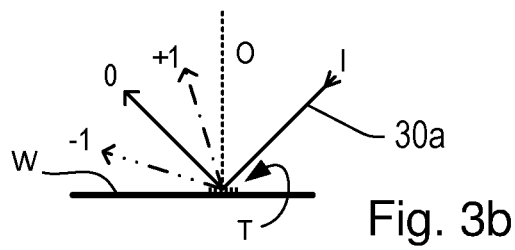

In a first example illumination mode, aperture 13N is used and rays 30a are provided so that the angle of incidence is as shown at 'I' in FIG. 3(b). The path of the zero order ray reflected by target T is labeled '0' (not to be confused with optical axis 'O'). In a second illumination mode, aperture 13S is used, so that rays 30b can be provided, in which case the angles of incidence and reflection will be swapped compared with the first mode. In FIG. 3(a), the zero order rays of the first and second example illumination modes are labeled 0(13N) and 0(13S) respectively. Both of these illumination modes will be recognized as off-axis illumination modes. Many different illumination modes, including on-axis illumination modes can be implemented for different purposes.

As shown in more detail in FIG. 3(b), target grating T as an example of a target structure is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 20 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy. As an example of an aperture stop 21, aperture 21a can be used which allows passage of on-axis radiation only. Using off-axis illumination in combination with aperture 21a, only one of the first orders is imaged at a time.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 3(b) and the first example illumination mode with rays 30a, +1 order diffracted rays from the target grating will enter the objective lens 16 and contribute to the image recorded at sensor 23. When the second illumination mode is used, rays 30b are incident at an angle opposite to rays 30b, and so the −1 order diffracted rays enter the objective and contribute to the image. Aperture stop 21a blocks the zeroth order radiation when using off-axis illumination. As described in the prior publications, illumination modes can be defined with off-axis illumination in X and Y directions.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture 21 could be used to pass substantially only one first order of diffracted light to the sensor. In a further example, a pair of off-axis prisms 21b are used in combination with an on-axis illumination mode. These prisms have the effect of diverting the +1 and −1 orders to different locations on sensor 23 so that they can be detected and compared without the need for two sequential image capture steps. This technique, is disclosed in the above-mentioned published patent application US2011102753A1, the contents of which are hereby incorporated by reference. 2nd, 3rd and higher order beams (not shown in FIG. 3) can be used in measurements, instead of or in addition to the first order beams. As a further variation, the off-axis illumination mode can be kept constant, while the target itself is rotated 180 degrees beneath objective lens 16 to capture images using the opposite diffraction orders.

In the following disclosure, techniques will be illustrated for measuring focus performance of a lithographic process that uses oblique illumination on a reflective type of patterning device I assume we are not excluding DUV scanners here? (transmissive reticles) At least we shouldn't. These techniques may be applied in particular in EUV lithography, where reflective optics in a near-vacuum environment are required. Metrology targets including certain focus metrology patterns will be printed on the substrate, at the same time as product features are printed. Asymmetry in these printed patterns will be measured using for example diffraction based techniques in the apparatus of FIG. 3. To allow the use of small targets, it will be assumed that these asymmetry measurements will be performed using the dark-field imaging branch of the apparatus. Diffraction-based measurements of asymmetry can also be made using the pupil imaging branch, however. Of course, the apparatus shown in FIG. 3 is only one example of an inspection apparatus and method that may be used to measure asymmetry.

In the context of lithographic apparatuses working in the DUV wavelength range, targets for diffraction-based focus (DBF) measurements have been designed and used successfully. A known type of DBF target is produced by including sub-segmented features in a grating pattern on the reticle. These features have dimensions below the imaging resolution of the lithographic apparatus, alongside more solid features. Consequently, they do not print as individual features in the resist layer on the substrate, but they influence the printing of the solid features, in a manner that is sensitive to focus error. Specifically, the presence of these features creates an asymmetric resist profile for each line in the grating within the DBF metrology target, with the degree of asymmetry being dependent upon focus. Consequently a metrology tool such as the inspection apparatus of FIG. 3 can measure the degree of asymmetry from a target formed on the substrate, and translate this into the scanner focus.

Unfortunately, the known DBF metrology target designs are not suitable for use in all situations. In EUV lithography, resist film thicknesses are significantly lower than those used in DUV immersion lithography, leading to low diffraction efficiency and difficulty extracting accurate asymmetry information from diffracted radiation in the scatterometer. In addition, since the resolution of the imaging system is inherently higher in EUV lithography, features having dimensions below the printing resolution of DUV immersion lithography become "solid" features printable by EUV lithography. To provide analogous sub-resolution features on an EUV reticle is rather impractical, and/or may violate semiconductor manufacturer's "design rules". Such rules are generally established as a means to restrict the feature designs to ensure the printed features conform to their process requirements. In any case, working outside the design rules makes it difficult to simulate the performance of the process on the DBF targets, so that the optimum target design and the calibration of focus measurements becomes a matter of trial-and-error. The desire to conform to design rules applies to DBF targets in DUV lithography, not only EUV lithography.

The focus (DBF) metrology target should have a unique, and preferably monotonic, asymmetry signal as a function of target defocus. In this context, an asymmetry signal may describe a difference (e.g., an intensity and/or phase difference) in opposing higher diffraction orders (e.g., +1 and −1 diffraction orders). It is also important that precision and sensitivity is high. Other considerations include minimizing dose and other cross talk effects (e.g., resultant from processing effects), and the tool-to-tool matching between inspection tools should be good.

It has been observed a good principle for a target is one based on a differential of two Bossung like signals with a focus shift between them. Most present techniques will yield a single Bossung, with no sign information and zero sensitivity around best focus.

Figure 4:
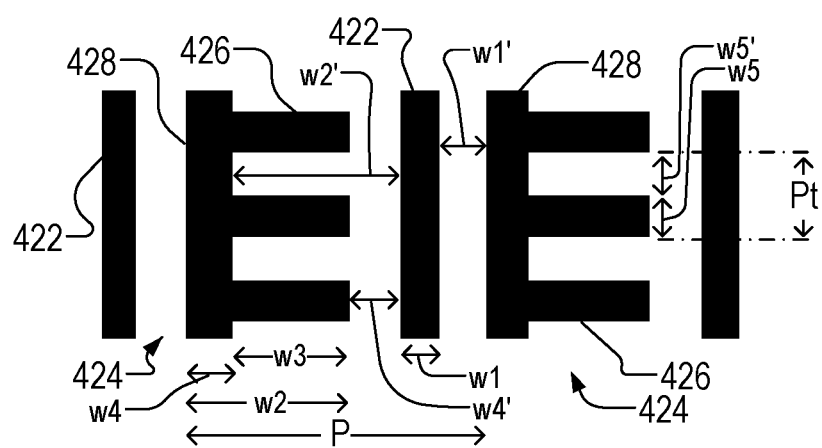
FIG. 4 shows a prior described example focus metrology pattern.

FIG. 4 illustrates a previous example for addressing the issues raised, as described in European Patent Application No. 17177774.1. The Figure shows in isolation a small portion of a focus metrology pattern. The repeating unit of this pattern comprises one first feature 422 and one second feature 424, spaced from each other in the direction of periodicity. The direction of periodicity in this example may be the X direction of the patterning device and substrate. Each first feature 422 comprises a bar or other feature each having a minimum dimension w1 that is close to but not less than a resolution limit of the printing step. This value w1 may be for example less than 50 nanometers in the direction of periodicity. A second space, between each first feature 422 and its next nearest neighboring second feature 424, has a dimension w2' and is similar to the dimension w2 of the second features 424 themselves. Consequently, it will be seen that the pattern T comprising thin first features and thicker second features is effectively present in both positive and negative form. Putting these dimensions w1, w1' together with the much larger period P, it will be appreciated that the dimensions w2 and w2' are much greater than the minimum dimension w1 of the first features 422, and consequently much greater than the resolution limit of the printing step. Dimensions w2 and w2' may each be, for example, over four times, over five, six, eight or ten times the dimension w1. Each second feature in the periodic array further includes sub-features 426 having minimum dimensions close to but not less than a resolution limit of the printing step in a direction transverse to said direction of periodicity. The sub-features in this example are lines projecting asymmetrically from a main body 428 of the first feature. The length of these projecting lines or fingers is labelled w3. The main body 428 of each second features 424 defines a minimum dimension w4 of the second features in the direction of periodicity. Accordingly, in this notation, maximum dimension w2 of the second features 424 is equal to w3+w4. The minimum dimension of the sub-features in the transverse direction is labeled w5.

It is understood that it is only the gap between the sub-features 426 and the first features 422 changes through focus. And moreover, this variation is linear or at least monotonous, resulting in a monotonous asymmetry signal when the target is measured. It is therefore assumed that this gap depends on different Bossung behavior between that of a first edge defined by the ends of the sub features and a second edge defined by the first features 422. The first edge effectively pulls back (the length of sub-features 426 become smaller) with defocus while the position of the second edge remains relatively stable. An effective Bossung shift may also come from a physical height difference: the sub-features 426 being effectively sampled at a lower resist height than the first features 422.

However, the inventor believes that sensitivity to focus, with respect to the target design of FIG. 4, could be improved upon. Better focus sensitivity means a stronger asymmetry signal and improved focus measurements.

Figure 5:
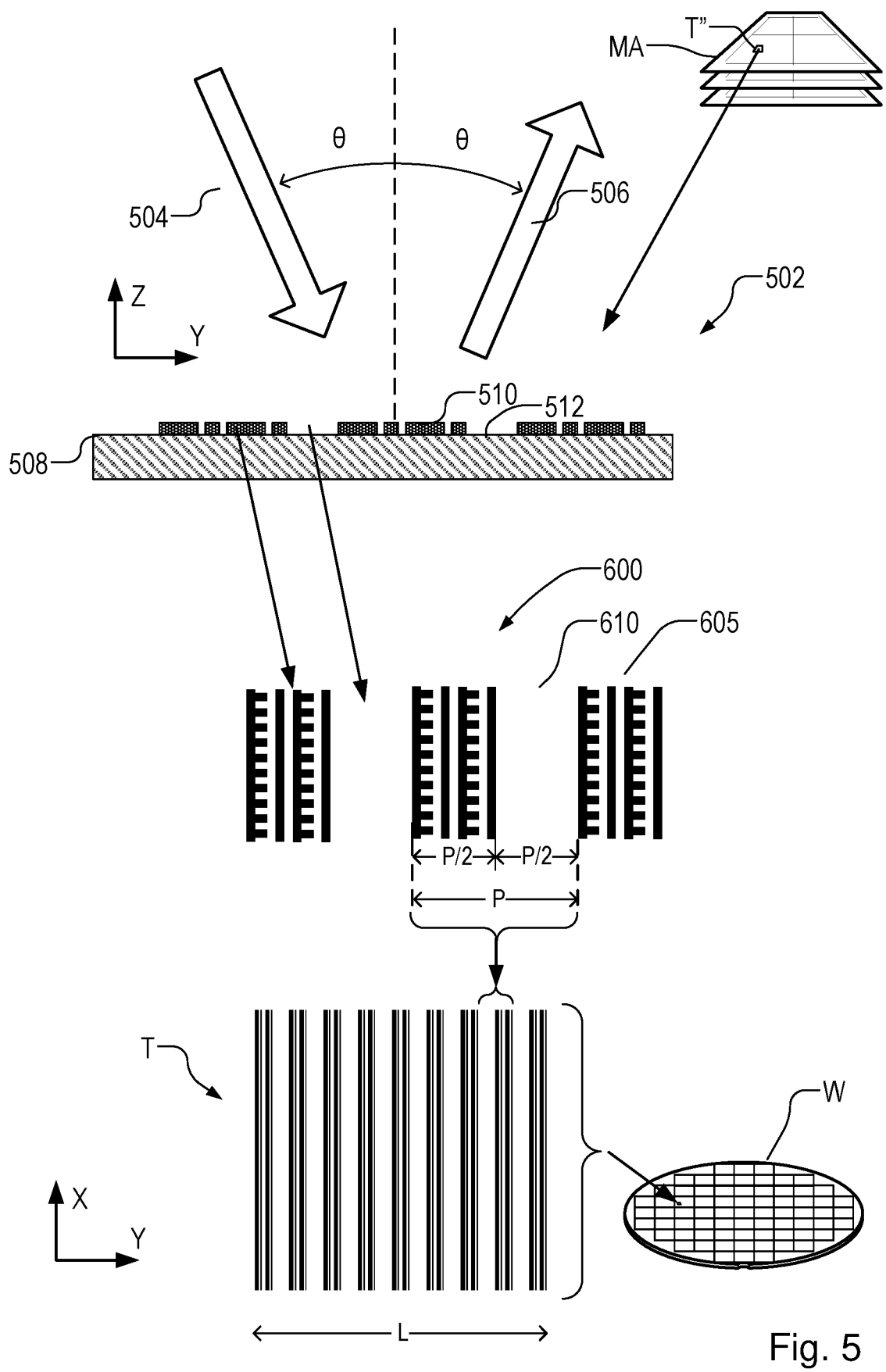
FIG. 5 illustrates the formation of a focus metrology target on a substrate using a reflective patterning device in one embodiment of the present invention.

FIG. 5 illustrates the principles of a method of measuring focus performance of a lithographic apparatus according to the present disclosure. In the disclosed method, the lithographic apparatus is used to print at least one focus metrology pattern T on a substrate W. The printed focus metrology pattern T comprises an array of features that is periodic in at least one direction. For the purpose of this example, the focus metrology pattern T is periodic in the Y direction, which corresponds to the scanning direction of the lithographic apparatus. In a lithographic apparatus of the type described, the direction of illumination is at an oblique angle, within the Y-Z plane. The focus metrology pattern T is made periodic in the Y direction. By measuring asymmetry in the printed focus metrology pattern, for example using an inspection apparatus of the type described above, a measurement of focus performance can be derived.

Patterning device MA comprises reflective and non-reflective portions to define features of one or more device patterns and one or more metrology patterns. As one type of metrology pattern of interest for the present disclosure, a focus metrology pattern T to be formed on the substrate W is defined by a corresponding pattern T'' formed on reflective patterning device MA. An enlarged detail of part of the reticle is shown at 502. The printing operation which transfers this pattern onto a resist layer on substrate W is performed in the lithographic apparatus of FIG. 1 by illuminating the reticle with EUV radiation 504 radiation incident at an oblique angle θ, which may be for example in the range of 5° to 10°. Reflected radiation 506 carrying information of the metrology target pattern (and all the product features desired to be printed on the substrate) enters the projection system PS. The basis of the reticle is a reflective structure 508, which is typically a multilayer structure, adapted to reflect a wavelength of radiation used in the lithographic apparatus. The EUV radiation is typically shorter than 20 nanometers. For example, a wavelength of approximately 13.5 nm is used in current implementations, which are based on a tin plasma radiation source.

On top of the reflective structure 508, radiation-absorbent structure 510 is provided, which may comprise a layer of EUV-absorbing material, and optionally a protective capping layer. Structure 510 is selectively removed so as to leave reflecting portions 512, with non-reflecting portions being defined by radiation-absorbent structure 514, in accordance with the pattern that is desired to be printed ican pn the resist material on the substrate. Depending on the type of resist material used, the developed pattern may have resist features corresponding to the reflective portions (negative tone resist) or to the non-reflective portions (positive tone resist). For the present illustration, a positive resist process will be assumed, unless otherwise stated. The teaching of the present disclosure can readily be adapted by the skilled person to either type of process.

Focus metrology pattern T comprises a grating pattern with a length L in a direction of periodicity. The direction of periodicity in this example is the Y direction, as mentioned. The period P of the structure is marked, and an enlarged portion of the pattern including one of the repeating units 600 is shown. Each repeating unit in this example comprises a periodic repetition of a pattern region 605 with a space region 610. The skilled person will understand that the projection system PS of a typical lithographic apparatus will apply a predetermined de-magnification factor when printing the pattern from the patterning device MA onto the substrate W. Accordingly, the dimensions of features given in the following examples will be understood to refer to the sizes of features as printed on the substrate, and the sizes of the corresponding features on the patterning device such as reticle 502 may be physically several times larger. This scaling factor should be taken for granted in the following description, and will not be mentioned again. Similarly, unless the context otherwise requires, the dimensions of features of the metrology pattern T are stated as would be if the pattern is perfectly transferred from the patterning device to the resist. As will be appreciated, the basis of the focus metrology method is that the features will not be perfectly printed, when a non-zero focus error is present.

The wavelength of radiation used in the printing step, for example EUV radiation, is much shorter than the wavelengths of radiation typically used to measure asymmetry in the inspection apparatus of FIG. 3. EUV radiation may be defined as radiation in the range 0.1 nm to 100 nm while the wavelength of radiation used in the printing step may be for example less than 20 nanometers. The inspection apparatus in some embodiments may use visible or infrared radiation at one or more wavelengths in the range 200 to 2000 nm. The wavelength of radiation used in the printing step may be in such cases ten or more times shorter than the wavelength of radiation used in the measuring of asymmetry. In other examples, the wavelength of the measuring radiation may be shorter than 200 nm, for example in the range 150-400 nm or even 100 nm to 200 nm.

Whichever radiation wavelengths are used for the printing of the pattern and the measuring of it, the focus metrology pattern contains features with a range of properties adapted to suit these conditions. Dimensions of features comprised within the pattern region 605 are designed to have a dimension similar to the smallest features printed as part of the product patterns. If this were not so, focus sensitivity would be significantly lower, resulting in lower precision. Furthermore, this focus performance measured using the focus metrology pattern T might not accurately represent focus performance in the actual product features of interest.

On the other hand, in view of the longer wavelengths used in the inspection apparatus (even allowing for the fact that inspection apparatus using shorter wavelengths might be applied), these individual first features are too small to be resolved directly by the inspection apparatus. By arranging groups of first features in a grating pattern having an overall period P that is comparable to the inspection apparatus wavelength, a diffraction spectrum of the pattern as a whole becomes resolvable in the inspection apparatus, and properties of the smaller features can be inferred. The period P of the grating pattern may for example be 350 nm or 450 nm or 600 nm. The overall length L of the grating pattern may be, for example, 5 µm. Such a size allows the pattern to be included within the scribe lanes or even in the device areas, but still resolved using the dark-field imaging branch of the inspection apparatus of FIG. 3. (If measurements are to be made using the pupil imaging branch, then a larger target is typically required, for example with L of 30 µm or 40 µm so that the illumination spot S can be placed entirely within the grating.) The relative sizes of features and gratings, and numbers of features in each grating are not intended to be shown to scale in any of the figures here.

FIG. 6 shows various focus metrology patterns according to embodiments. It will be appreciated that these illustrations are purely exemplary, and of course other examples can be envisaged, based on the principles disclosed herein. In all of the examples, only a small section of the pattern is shown, including a repeating unit with period P.

Figure 6A:
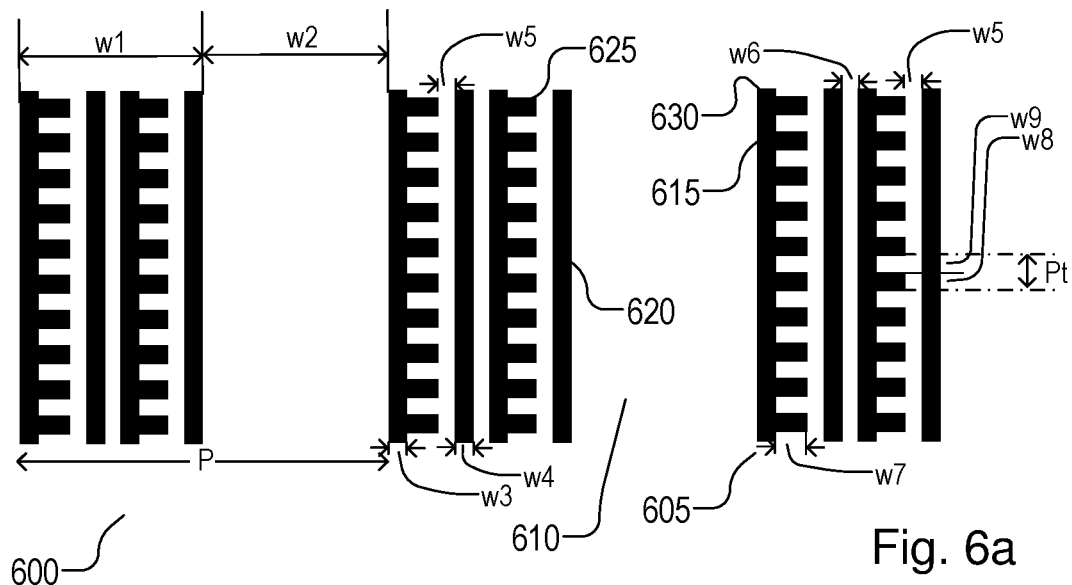
FIGS. 6a, 6b, 6c show schematically, examples of focus metrology patterns for use in embodiments of the invention.
Figure 6B:
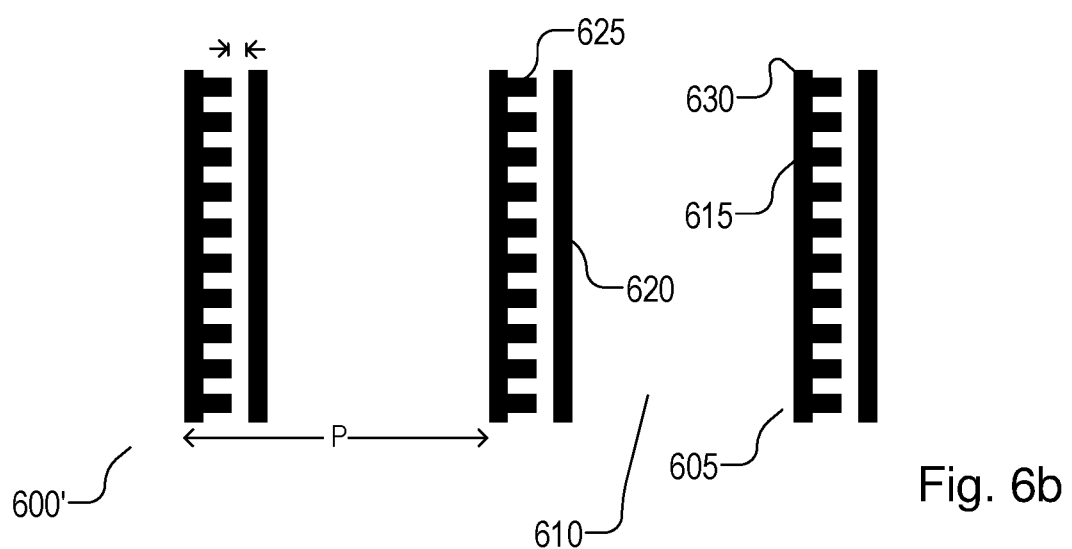
Figure 6C:
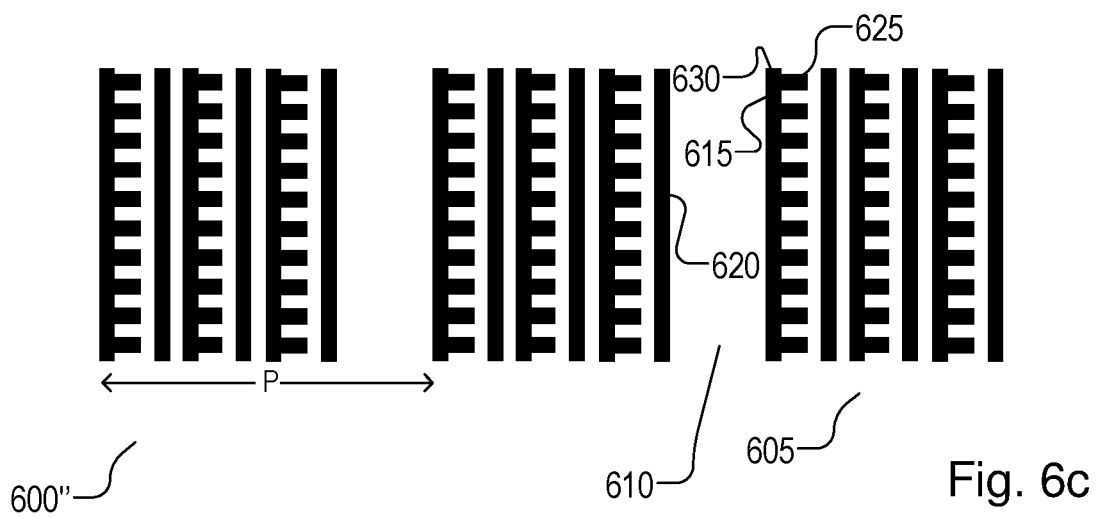

FIG. 6(a) shows in isolation a small portion of the same focus metrology pattern that is used as the example in FIG. 5. This type of pattern may be used to measure focus performance for an EUV lithographic process using a reflective patterning device MA, or a conventional transmissive process.

The target design comprises a periodic pattern 600 comprising repeated instances of a pattern region 605 and space region 610. The pattern region comprises at least one iteration of a first feature 615, hereafter referred to as a comb feature 615 and at least one second feature 620, hereafter referred to as a line feature 620. Comb feature 615 comprises sub-features 625, which in this example are lines projecting asymmetrically from a main body 630 of the first feature. The length of these projecting lines or fingers is labelled w7. In FIG. 6(a), each pattern region 605 of periodic pattern 600 has one repetition of comb feature 615 and line feature 620 (e.g., two of each), in FIG. 6(b) each pattern region 605 of periodic pattern 600' has only one comb feature 615 and one line feature 620, and in FIG. 6(c), each pattern region 605'' of periodic pattern 600 has two repetitions of comb feature 615 and line feature 620. For each repetition (pair of first feature and second feature), the fingers 625 of the comb feature 615 are adjacent (i.e., facing) the at least one line feature 620. Note that this is in contrast to the FIG. 4 arrangement.

As previously discussed, a focus measurement response to the target, when formed on a substrate and measured, should comprise two shifted Bossung curves. In the proposed target design, a first Bossung response may result from the focus response of fingers 625 and a second Bossung response may result from the line feature 620. A relative shift in the peaks of these first and second Bossung curves may result from the fact that the finger 625 is effectively sampled at a lower height (z-direction) in resist. An additional asymmetry mechanism may be based on the sidewall angle of the fingers 625.

It is believed that an about 1:1 line-space ratio defined by (i.e., the ratio of) the pattern region 605 and space region 610 may yield a maximum signal (asymmetry) intensity. It is this line-space periodic pitch that is detected by the metrology device (scatterometer) during a measurement; the sub-features 625 and main body 630 of comb feature 615 are effectively seen as a thick line by a scatterometer. It is also believed that repeating the near resolution or at-resolution features will multiply the area which provides the focus-dependent signal, and thus the signal. The example of FIG. 6(a) has an effective line-space ratio of about 1:1 (i.e., w1 is about equal to w2), and one repetition of near resolution features. Therefore, this may be the better arrangement in terms of signal strength. However, it is also expected that the examples of FIGS. 6(b) and (c) will provide acceptable performance. For example, the width of the pattern region 605 and space region 610 may differ by no more than 100%, by no more than 50%, by no more than 20% or by no more than 10%. Alternatively. or in addition, in terms of line-space ratio (ratio between the pattern region 605 and space region 610), the ratio of the largest of these to the smallest of these (i.e., the largest:smallest ratio) should be less than 3:1, less than 2:1, or less than 3:2, for example.

Several parameters of the focus metrology pattern can be adjusted as part of a design process for an optimal focus metrology pattern. The optimal focus metrology may be different for each layer and each process of a product, particularly where operating parameters of the lithographic apparatus may be customized for each layer. Dimensions w1, w2, w3, w4, w5, w6, w7, w8, w9, pitch P and the finger pitch Pt of comb feature 615 may all vary, (between targets and/or even within a target). For example, pitch P may be between 300 nm and 800 nm or between 300 nm and 600 nm; for example period or pitch P may be 350 nm, 450 nm or 600 nm. Design parameters may be expressed in any suitable format. Ratios such as the ones just given may be convenient for expressing relative dimensions of features, while absolute dimensions may be expressed directly, or by ratios relative to a specified resolution limit, and/or relative to the period P. In the illustrated example, with a period P of 450 or 600 nm, the linewidths w3, w4 and w8 (for, respectively, the main body of comb features, the line features and the fingers) and the spaces w5, w6, w9 (spaces between the comb features and the line features, and between each finger) may all have the same dimension; e.g., to be on the order of between 20 nm and 40 nm, e.g., 22 or 30 nm. The dimension w7 (length of the fingers 625) may be approximately twice the linewidth e.g., to be on the order of between 40 nm and 80 nm, e.g., 44 or 60 nm.

Generally speaking, the person skilled in imaging technology will consider that features are effectively isolated from one another, if the space between them is five or six times dimensions of the features themselves. Here, the maximum spacing between each of comb feature and each line feature within each pattern region is not greater than twice the resolution limit of the lithography apparatus used to print the target. For example, this spacing may be no greater than 100 nm, no greater than 80 nm, no greater than 60 nm, no greater than 40 nm, no greater than 30 nm or no greater than 20 nm. Thus, in this example, the features 615, 620 of each pattern region 605 are not isolated from each other, but each pattern region 605 is isolated from its neighboring pattern region(s).

Figures 7A, 7B:
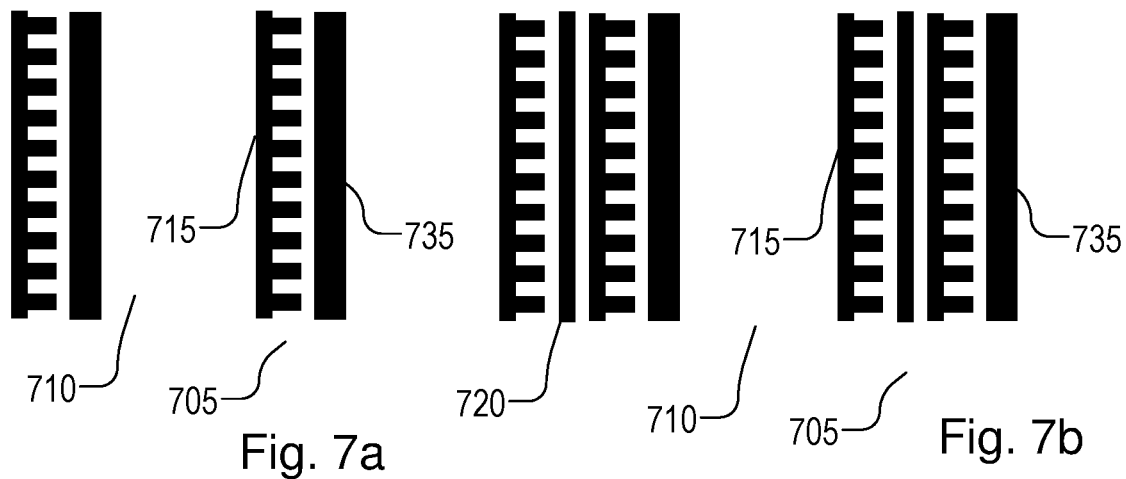
FIGS. 7a, 7b, 7c, 7d, 7e, 7f show schematically, further examples of focus metrology patterns for use in embodiments of the invention.

FIG. 7 shows a number of variations on the targets described herein. In the FIG. 6 embodiments, the (thin) line feature 620 is effectively floating which is not ideal. In terms of imaging, the last line in a simple grating always prints differently to the other lines because it does not have a neighboring structure. For a good signal, the last thin line should print the same as all other thin lines. Therefore, it is proposed that the last thin line is thickened or comprises an additional dummy neighbor, to maximize this similarity. In FIG. 7, the effective thickness of the right edge of each pattern region 705 has been increased to improve stability of this edge. FIGS. 7(a), (c) and (e) are examples with no repetition, respectively, of equivalent single repetition examples of FIGS. 7(b), (d) and (f). More specifically, the pattern illustrated in FIGS. 7(a), (c) and (e) comprises a pattern region 705 having a single comb feature 715 and line feature 735, 735', 735" alternating with a space region 710, and the pattern illustrated in FIGS. 7(b), (d) and (f) comprises a pattern region 705 having one repetition of comb feature 715 and line feature 720, 735, 735', 735" alternating with a space region 710. The basic principles can be extended to other repetition examples, e.g., the two repetition example of FIG. 6(c), where space allows. In the illustrated embodiment, it can be seen that for the multiple repetition examples, the pattern does not repeat exactly; i.e., right hand line feature 735, 735', 735" is different to other line features 720.

Figures 7C, 7D:
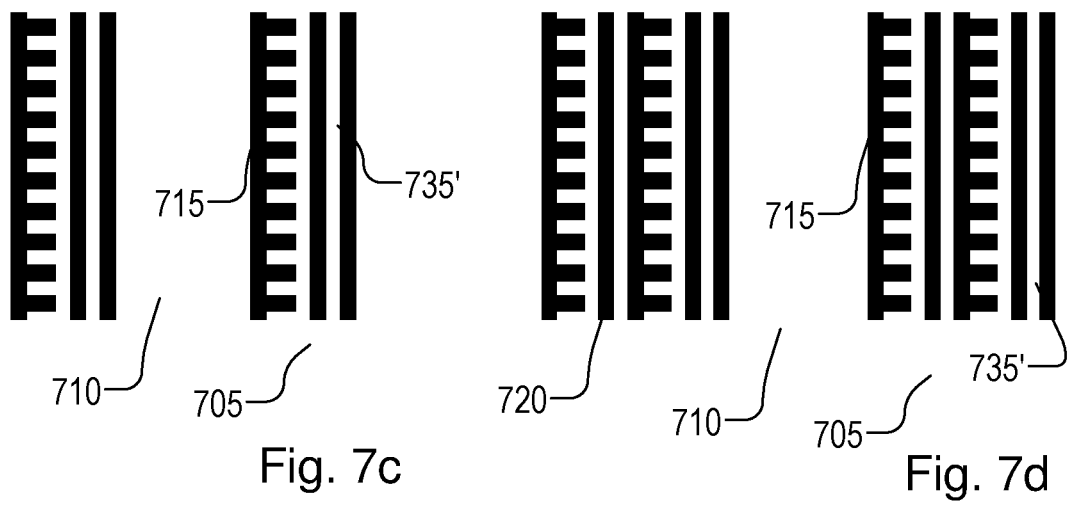
Figures 7E, 7F:
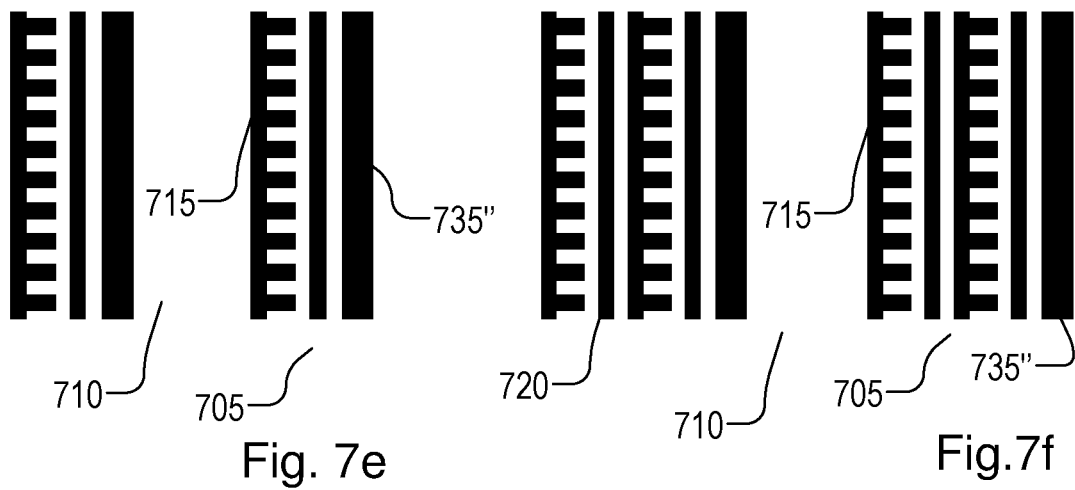

In FIGS. 7(a) and (b) the right hand line feature 735 has been made thicker. For example it may be about 1.5 times or twice as thick as the line feature 720 (e.g., about 1.5 times or twice as thick as the line feature 620 of FIG. 6). Note that, for the single repetition example of FIG. 7(b), it is only the second line feature 735 which is made thicker. In FIGS. 7(c) and (d), the right hand line feature 635' comprises a dual thin-thin line, e.g., two lines, each being similar to that of line feature 720. In FIGS. 7(e) and (f), the right hand line feature 635" comprises a dual thin-thick line, e.g., two lines, the outermost line being thicker than the innermost line. For example the thinner line may be similar to that of line feature 720 and the thicker line may be 1.5 times or twice as thick.

While targets including the above focus metrology target patterns may yield focus measurements (when appropriately designed for the process), there is also an expectation that the focus measurement of a target will be subject to uncertainty because of the wide variety of aberrations and/or image distortions that can be introduced, besides focus. Accordingly, embodiments of the measurement method are also disclosed in which multiple differential measurements are made on two or more focus metrology patterns. These may be provided in complementary pairs, with mirrored asymmetry in their designs, and/or in pairs with design differences other than mirror symmetry.

Figure 8A:
FIGS. 8a and 8b illustrate two complementary variants of the focus metrology target pattern shown in FIG. 5(a)
Figure 8B:

FIG. 8 illustrates two complementary focus metrology patterns that can be used together to obtain an improved measurement of focus. Purely by way of example, the pattern of FIG. 6(a) has been selected as the basis for this complementary pair, as seen in FIG. 8(a). The other pattern of the pair seen at FIG. 8(b) is a mirror image.

Figure 9:
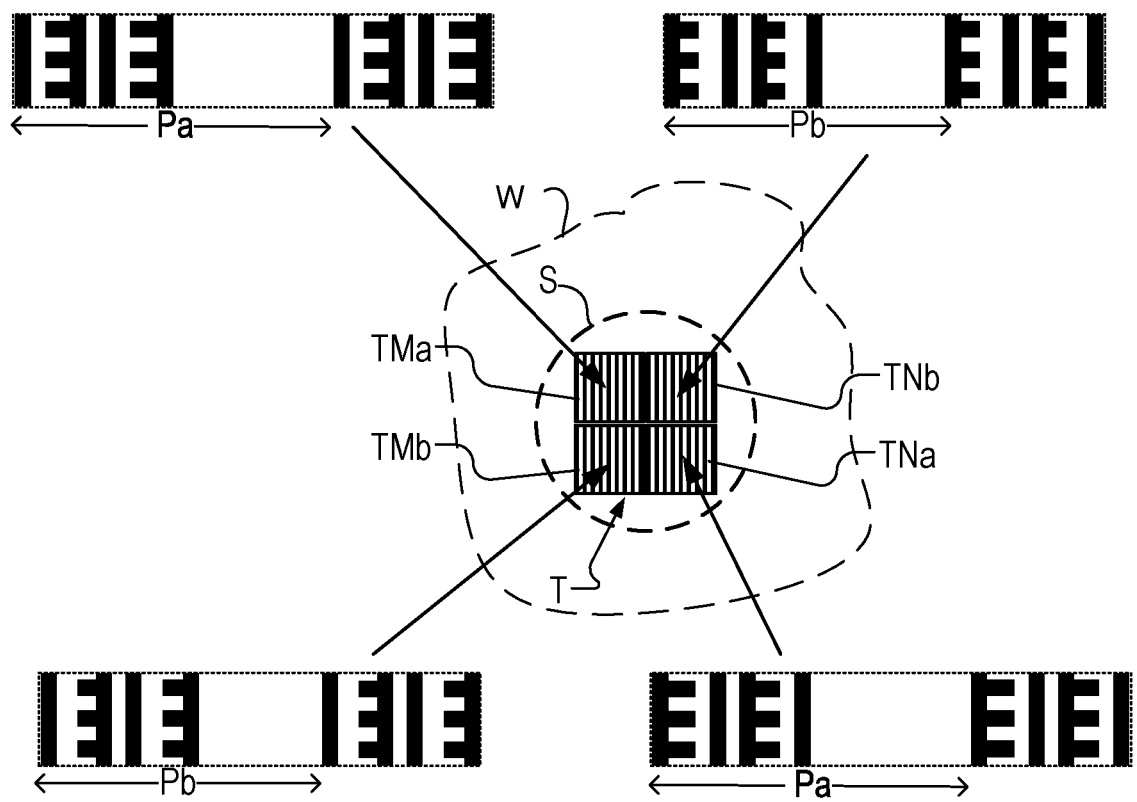
FIG. 9 shows the formation of a composite focus metrology target comprising complementary variants of focus metrology patterns of the type shown in FIGS. 8(a) and (b)

FIG. 9 shows the printing of two or more complementary patterns side by side on a substrate W, forming a composite focus metrology target T. In this particular example, there are four focus metrology patterns, arranged in two complementary pairs TNa/TMa and TNb/TMb. In each complementary pair, the first pattern (printed on the right) is labeled TN (using N for 'normal') while the second pattern is printed on the left and labeled TM (M for 'mirror'). It will be understood that the labels are arbitrary, but the effect is that the printed focus metrology pattern comprises at least first and second periodic arrays of features, each periodic array of features forming an individual focus metrology pattern. There is then a programmed asymmetry within each periodic array, the asymmetry of the second periodic array being opposite to that of the first periodic array, to form a complementary pair. To obtain an improved focus measurement then includes measuring asymmetry of each of the first and second periodic arrays and determining a measure of focus performance by combining the asymmetries measured for the periodic arrays (TN, TM).

By combining results from measurements using targets that have opposite asymmetries in their designs, the focus measurement can be made less sensitive to asymmetries that arise in the projection system or the metrology system, that otherwise might be mistaken for focus error. Particular types of imperfection that can be discriminated using a complementary pair of patterns in this way are coma and projection asymmetry. For example, coma may be expected to introduce asymmetry in a particular direction, when the image is defocused. By contrast, the asymmetry induced by focus error will be opposite in the "mirrored" pattern compared with the "normal" pattern. Combining the asymmetry measurements from both allows the actual focus error to be more accurately measured.

Additionally, in this example, two complementary pairs of targets are provided, identified by the suffixes 'a' and 'b'. Between these pairs, the design parameters of the focus metrology patterns are varied. As a first difference, the period Pa of the pair TNa/TMa is longer than the period Pb of the pair TNb/TMb, and lengths of the "fingers" have been shortened. In other embodiments, different parameters could be varied (e.g., any one or more of w1, w2, w3, w4, w5, w6, w7, w8, w9 or Pt), and the periods P could be the same or different. Alternatively or in addition to providing different pattern designs, different capture conditions can also be used to obtain more diverse signals. For example, different wavelengths and/or polarizations of radiation can be used to obtain diffraction signals.

Figure 10:
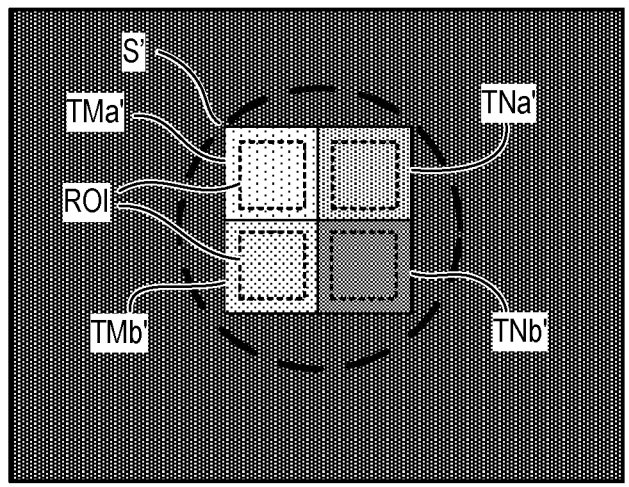
FIG. 10 shows a dark-field image of the metrology focus patterns of the target of FIG. 9, obtained using the apparatus of FIG. 3.

As illustrated in FIG. 9, therefore, a composite focus metrology target T can be formed by one or more complementary pairs focus metrology patterns TN and TM being printed in the same step. As illustrated, these individual patterns may be imaged simultaneously using radiation spot S in the dark field imaging mode of the inspection apparatus of FIG. 3. In other words, measurements of asymmetry in both of these focus metrology patterns can be taken by taking first and second images using the +1 and −1 order diffracted radiation collected by the apparatus. One such image is shown in FIG. 10. The dark rectangle represents the dark-field image as recorded on sensor 23 in the apparatus of FIG. 3, for example. A circle S' indicates the area of radiation spot S, imaged onto the detector. Brighter rectangles TNa', TNb', TMa' and TMb' represent the images of the corresponding focus metrology patterns TNa, TNb, TMa and TMb, respectively. The intensity of one diffraction order from each target can be measured by, for example, defining a region of interest ROI within each of the brighter rectangles, and averaging the pixel values. Repeating this for the opposite diffraction order allows asymmetry to be calculated. In an alternative measurement method using the prisms 21b shown in FIG. 3, then effectively both images of both patterns can be captured simultaneously.

The principles illustrated in FIGS. 8 to 10 can be applied to any of the patterns illustrated in FIGS. 6 and 7.

In yet other embodiments, asymmetry of each focus metrology pattern may be measured separately, for example using the pupil imaging branch of the inspection apparatus of FIG. 3, or a more general angle-resolved scatterometer. The opposite diffraction orders from one pattern are located in complementary regions of the pupil image, but only one pattern can be measured at a time.

Figure 11:
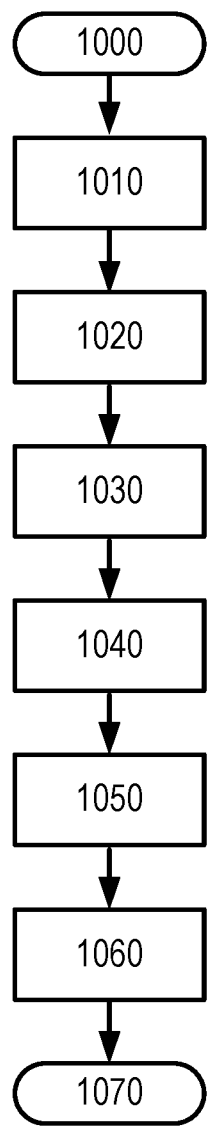
FIG. 11 is a flowchart of a method of monitoring focus according to an embodiment of the invention.

FIG. 11 is a flowchart of the steps of a method for measuring focus performance of a lithographic process according to an exemplary embodiment. The method can be performed using any of the example focus metrology patterns described above and illustrated in the drawings. The steps are as follows, and are then described in greater detail thereafter:

1000—Start by defining a product design or metrology wafer design with metrology targets, and preparing a suitable set of patterning devices (reticles). In advance of production, make exposures with known focus-exposure variations and measure these to obtain one or more calibration curves. (This may involve an iterative loop of design, exposure and measurement steps.)

1010—Print one or more focus metrology patterns alongside product patterns on a substrate;

1020—Measure intensity of a portion of the diffraction spectrum of each focus metrology pattern using a suitable inspection apparatus (for example the +1 order is a suitable portion of the diffraction spectrum);

1030—Measure intensity of an opposite portion of the diffraction spectrum (for example, −1 order) of each focus metrology pattern using the inspection apparatus;

1040—Calculate measurements of asymmetry of one or more focus metrology patterns by comparing the intensities of the opposite diffraction orders;

1050—Using the asymmetry measurements, with the calibration curves stored in step 1000 and/or other measurements such as SEM, calculate focus error at the time of printing the focus metrology pattern.

1060—Use the derived focus measurement in focus setting for exposures on sub sequent substrates.

1070—End or repeat.

As already explained, step 1020 and step 1030 may be performed as a single step such that the opposite diffraction orders of a focus metrology pattern can be obtained in a single acquisition. In addition, where there are two or more patterns being measured, for example one or more complementary pairs of patterns shown in FIG. 9, opposite diffraction orders for these two or more patterns may be measured using a single image acquisition, to obtain a corresponding number of asymmetry measurement values.

Although the measurement steps are shown being made by a scatterometer, as a dedicated inspection apparatus, this may be a stand-alone apparatus or it may be integrated in the lithocell. Moreover, asymmetry measurements can be made without dedicated metrology apparatus, for example using suitable targets with the alignment sensors provided in the lithographic apparatus.

Calculation steps 1040 and 1050 can all be performed in a processor of the inspection apparatus, or may be performed in different processors associated with monitoring and control of the lithographic apparatus. Each step may be performed by a programmed processor, and it is an advantage of the techniques disclosed, that the inspection apparatus can be modified to perform the focus measurement methods without hardware modification.

Further embodiments are disclosed in the subsequent numbered clauses:
1. A method of measuring focus performance of a lithographic apparatus, the method comprising:
    (a) obtaining measurement data relating to measured asymmetry between opposite portions of a diffraction spectrum for a first periodic array in a printed focus metrology pattern on a substrate; and (b) deriving a measurement of focus performance based at least in part on the asymmetry comprised within the measurement data,
wherein said first periodic array comprises a repeating arrangement of a space region having no features and a pattern region having at least one first feature comprising sub-features projecting from a main body and at least one second feature; and wherein the first feature and second feature are in sufficient proximity to be effectively detected as a single feature when measured in a measurement step.
2. A method as defined in clause 1, wherein a maximum spacing between each of said at least one first feature and at least one second feature within each pattern region is not greater than twice the resolution limit of the printing step.
3. A method as defined in clause 1 or 2, wherein a maximum spacing between each of said at least one first feature and at least one second feature within each pattern region is not greater than 80 nm.
4. A method as defined in any preceding clause, wherein said each said sub-features project asymmetrically from the main body.
5. A method as defined in any preceding clause, wherein each second feature is located on the same side of the main body of a respective one of said first features as from which said sub-features extend.
6. A method as defined in any preceding clause, wherein an outermost second feature of each pattern region has an effective thickness at least twice that of the spacing between first feature and second feature and/or the main body of said first feature.
7. A method as defined in clause 6, wherein said outermost second feature comprises either:
a single line feature having a thickness of at least 1.5× that of the spacing between first feature and second feature and/or the main body of said first feature,
a dual line feature comprising two adjacent lines, or
a dual line feature comprising two adjacent lines wherein the outermost line has a width at least 1.5 times that of the spacing between first feature and second feature and/or the main body of said first feature.
8. A method as defined in any preceding clause, wherein each second feature comprises a line.
9. A method as defined in any preceding clause, wherein each pattern region comprises at least one repetition of said first feature and second feature.
10. A method as defined in any preceding clause, wherein a minimum dimension of each first feature and second feature is close to but not less than a resolution limit of the printing step.
11. A method as defined in any preceding clause, wherein the largest:smallest ratio of the width of the space region and the width of the pattern region in the direction of periodicity is less than 3:1.
12. A method as defined in any preceding clause, wherein the largest:smallest ratio of the width of the space region and the width of the pattern region in the direction of periodicity is less than 2:1.
13. A method as defined in any preceding clause, wherein the largest:smallest ratio of the width of the space region and the width of the pattern region in the direction of periodicity is less than 3:2.
14. A method as defined in any preceding clause wherein the printed focus metrology pattern comprises at least first and second periodic arrays of features, each periodic array of features having a form as specified in said preceding clause, wherein there is a programmed asymmetry within each periodic array, the asymmetry of the second periodic array being opposite to that of the first periodic array, and wherein said asymmetry within the measurement data comprises asymmetry of each of the first and second periodic arrays and step (b) determines said measure of focus performance by combining the asymmetries correspond to the periodic arrays.
15. A method as defined in clause 14 wherein said sub-features are arranged such that each second feature is asymmetric within regard to the direction of periodicity, and wherein the asymmetry of each second feature in the second periodic array of features is opposite to that in the first periodic array of features.
16. A method as defined in any preceding clause wherein the measurement in step (a) is performed using radiation having a wavelength at least twice as long as said minimum dimension of the first features and/or second features.
17. A method as defined in any preceding clause, wherein the measurement data corresponds to a measurement performed using radiation having a wavelength longer than 150 nm while a wavelength of radiation used in printing the said focus metrology pattern is less than 20 nm.
18. A method as defined in any preceding clause, wherein the period of each of said periodic arrays of features in said focus metrology pattern is greater than 350 nm.
19. A method as defined in any preceding clause, comprising using inspection radiation to measure said asymmetry between opposite portions of a diffraction spectrum for the first periodic array in the printed focus metrology pattern.
20. A method as defined in any preceding clause, comprising using the lithographic apparatus to print at the least one focus metrology pattern on the substrate, the printed focus metrology pattern comprising at least said first periodic array of features.
21. A patterning device for use in a lithographic apparatus, the patterning device comprising reflective and non-reflective portions to define features of one or more device patterns and one or more metrology patterns, the metrology patterns including at least one focus metrology pattern, the focus metrology pattern comprising at least a first periodic array of features comprising a repeating arrangement of features arranged to define a space region having no features and a pattern region having at least one first feature comprising sub-features projecting from a main body and at least one second feature; and wherein the first feature and second feature are in sufficient proximity to be effectively detected as a single feature during a scatterometry based metrology action to measure asymmetry between opposite portions of a diffraction spectrum for the first periodic array as formed on a substrate.
22. A patterning device as defined in clause 21, wherein a maximum spacing between each of said at least one first feature and at least one second feature within each pattern region are such that imaged features formed on a substrate corresponding to each of said at least one first feature and at least one second feature when using said patterning device in an imaging step is not greater than 80 nm, taking into account any magnification factor applicable to the imaging step.
23. A patterning device as defined in clause 21 or 22, said sub-features project asymmetrically from the main body.

24. A patterning device as defined in clause 23, wherein each second feature is located on the same side of the main body of a respective one of said first features as from which said sub-features extend.
25. A patterning device as defined in clause 23 or 24, wherein an outermost second feature of each pattern region has an effective thickness at least twice that of the spacing between first feature and second feature and/or the main body of said first feature.
26. A patterning device as defined in clause 25, wherein said outermost second feature comprises either:
a single line feature having a thickness of at least 1.5 times that of the spacing between first feature and second feature and/or the main body of said first feature,
a dual line feature comprising two adjacent lines, or
a dual line feature comprising two adjacent lines wherein the outermost line has a width at least 1.5 times that of the spacing between first feature and second feature and/or the main body of said first feature.
27. A patterning device as defined in any of clauses 21 to 26, wherein each second feature comprises a line.
28. A patterning device as defined in any of clauses 21 to 27, wherein each pattern region comprises at least one repetition of said first feature and second feature.
29. A patterning device as defined in any of clauses 21 to 28, wherein the largest:smallest ratio of the width of the space region and the width of the pattern region in the direction of periodicity is less than 3:1.
30. A patterning device as defined in any of clauses 21 to 28, wherein the largest:smallest ratio of the width of the space region and the width of the pattern region in the direction of periodicity is less than 2:1.
31. A patterning device as defined in any of clauses 21 to 28, wherein the largest:smallest ratio of the width of the space region and the width of the pattern region in the direction of periodicity is less than 3:2.
32. A patterning device as defined in in any of clauses 21 to 31, wherein the focus metrology pattern comprises at least first and second periodic arrays of features, said repeating arrangement of features, wherein there is a programmed asymmetry within each periodic array, the asymmetry of the second periodic array being opposite to that of the first periodic array.
33. A metrology apparatus for measuring a parameter of a lithographic process, the metrology apparatus being operable to perform the method of any of clauses 1 to 20.
34. A lithographic system comprising:
a lithographic apparatus comprising:
an illumination optical system arranged to illuminate a reflective patterning device;
a projection optical system arranged to project an image of the patterning device onto a substrate; and
a metrology apparatus according to clause 33;
wherein the lithographic apparatus is arranged to use the measurement of focus performance derived by the metrology apparatus when applying the pattern to further substrates.
35. A lithographic system as defined in clause 34, wherein said reflective patterning device comprises the patterning device of any of clauses 21 to 32.
36. A lithographic cell comprising the metrology apparatus according to clause 33 or the lithographic system according to clause 34 or 35.
37. A computer program comprising processor readable instructions which, when run on suitable processor controlled apparatus, cause the processor controlled apparatus to perform the method of any of clauses 1 to 20.
38. A method of manufacturing devices wherein a device pattern is applied to a series of substrates using a lithographic process, the method including:
using the method of any of clauses 1 to 20 to measure focus performance of the lithographic process, and
controlling the lithographic process for later substrates in accordance with the measured focus performance.

CONCLUSION

In conclusion, a method of manufacturing devices using the lithographic process can be improved by performing focus measurement methods as disclosed herein, using it to measure processed substrates to measure parameters of performance of the lithographic process, and adjusting parameters of the process (particularly focus) to improve or maintain performance of the lithographic process for the processing of subsequent substrates.

While the target structures including and focus metrology patterns described above are metrology targets specifically designed and formed for the purposes of measurement, in other embodiments, properties may be measured on targets which are functional parts of devices formed on the substrate. Many devices have regular, grating-like structures. The terms "metrology pattern" and "metrology target" and the like as used herein do not require that the structure has been provided specifically for the measurement being performed.

The substrates on which these metrology patterns are formed may be production wafers or experimental wafers in product development. They may also be dedicated metrology wafers, for example monitor wafers which are processed intermittently as part of an advance process control (APC) mechanism.

In association with the physical grating structures defining the focus metrology patterns as realized on substrates and patterning devices, an embodiment may include a computer program containing one or more sequences of machine-readable instructions describing a method of designing focus metrology patterns, metrology recipes and/or controlling the inspection apparatus to implement the illumination modes and other aspects of those metrology recipes. This computer program may be executed for example in a separate computer system employed for the design/control process. As mentioned, calculations and control steps may be wholly or partly performed within unit PU in the apparatus of FIG. 3, and/or the control unit LACU of FIG. 2. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The breadth and scope of the present invention should not be limited by any of the above-described exemplary embodi-

The invention claimed is:

1. A method of measuring focus performance of a lithographic apparatus or process using a metrology apparatus, the method comprising:
   obtaining asymmetry information corresponding to opposite portions of a diffraction spectrum of a printed focus metrology pattern on a substrate, the asymmetry information being obtained, using a processor of the metrology apparatus, from a measurement signal generated by the metrology apparatus configured to optically inspect the printed focus metrology pattern comprising a first periodic array comprising:
      first and second pattern regions, each comprising a repeating arrangement of:
         a first feature comprising a main body and sub-features projecting from the main body; and
         a second feature disposed adjacent to the first feature, wherein a distance between the first and second features is smaller than an optical resolution of the metrology apparatus, and wherein the first and second features and sub-features of the first pattern region are structured same as the first and second features and sub-features of the second pattern region; and
      a space region having no features disposed between the first and second pattern regions, wherein a width of the space region is greater than a separation between successive ones of the repeating arrangement of the first or second pattern regions,
      wherein the asymmetry information is based on:
         an asymmetry of the first and second features;
         the first and second features and sub-features of the first pattern region being structured same as the first and second features and sub-features of the second pattern region; and
         the width of the space region being greater than the separation between successive ones of the repeating arrangement of the first or second pattern regions; and
   deriving a measurement of focus performance based on the asymmetry information.

2. The method of claim 1, wherein the deriving is further based on a maximum of the separation being at least one of:
   not greater than twice the resolution limit of a printing step of the lithographic apparatus or process; and
   not greater than 80 nm.

3. The method of claim 1, wherein the deriving is further based on the sub-features projecting asymmetrically from the main body.

4. The method of claim 1, wherein the deriving is further based on, for each of the first and second pattern regions, the second feature being disposed on a side of the main body from which the sub-features extend.

5. The method of claim 1, wherein:
   the deriving is further based on the second feature of an outermost one of the repeating arrangement having an effective thickness that is at least twice that of the distance between the first and second features; and
   the second feature of the outermost one of the repeating arrangement comprises:
      a single line feature;
      a dual line feature comprising two adjacent lines; or
      a dual line feature comprising two adjacent lines wherein an outermost one of the two adjacent lines has a width at least 1.5 times that of the distance between the first and second features.

6. The method of claim 1, wherein the deriving is further based on:
   the second feature of the first and second pattern region comprising a line;
   minimum dimensions of the first and second features of the first and second pattern regions being not less than a resolution limit of a printing step of the lithographic apparatus or process; and/or
   a largest-to-smallest ratio of the width of the space region and the width of the pattern region in a direction of periodicity is one of: less than 3:1, less than 2:1, or less than 3:2.

7. The method of claim 1, wherein:
   the printed focus metrology pattern further comprises a second periodic array comprising a repeating arrangement of:
      a first feature comprising a main body and sub-features projecting from the main body; and
      a second feature disposed adjacent to the first feature;
   a projection direction of the sub-features of the first periodic array is opposite from a projection direction of the sub-features of the second periodic array; and
   the deriving the measurement of focus performance comprises combining asymmetries arising from the projection direction of the sub-features of the first periodic array being opposite from the projection direction of the sub-features of the second periodic array.

8. The method of claim 1, wherein the obtaining the asymmetry information comprises analyzing the measurement signal based on the metrology apparatus performing the optically inspecting using radiation having a wavelength at least twice as long as a minimum dimension of the first features and/or second features.

9. The method of claim 1, further comprising performing the optically inspecting using radiation to generate the asymmetry information corresponding to the opposite portions of the diffraction spectrum of the printed focus metrology pattern.

10. A metrology apparatus for measuring a parameter of a lithographic process, the metrology apparatus comprising:
    a radiation source configured to generate radiation for irradiating a printed focus metrology pattern on a substrate;
    a detector configured to receive radiation scattered by the printed focus metrology pattern and to generate, based on the received radiation, a measurement signal comprising asymmetry information corresponding to opposite portions of a diffraction spectrum of the printed focus metrology pattern based on the printed focus metrology pattern comprising a first periodic array comprising:
       first and second pattern regions, each comprising a repeating arrangement of:
          a first feature comprising a main body and sub-features projecting from the main body along a projection direction; and
          a second feature disposed adjacent to the first feature, wherein a distance between the first and second features is smaller than an optical resolution of the metrology apparatus, and wherein the first and second features and sub-features of the first pattern region are structured same as the first and second features and sub-features of the second pattern region; and a space region having no features disposed between the first and second pattern regions, wherein a width of the space region is greater than a separation between successive ones of the repeating arrangement of the first or second pattern regions, a processor configured to:
  receive the measurement signal;
  analyze the asymmetry information of the measurement signal based on:
    an asymmetry of the first and second features;
    the first and second features and sub-features of the first pattern region being structured same as the first and second features and sub-features of the second pattern region; and
    the width of the space region being greater than the separation between successive ones of the repeating arrangement of the first or second pattern regions; and
  derive a measurement of focus performance based on the asymmetry information.

11. A lithographic system comprising:
  a lithographic apparatus comprising:
    an illumination optical system arranged to illuminate a reflective patterning device;
    a projection optical system arranged to project an image of the patterning device onto a substrate; and
    the metrology apparatus of claim 10;
  wherein the lithographic apparatus is arranged to use the measurement of focus performance derived by the metrology apparatus when applying the image of the patterning device to further substrates.

12. A lithographic cell comprising the metrology apparatus of claim 10.

13. A non-transitory computer-readable medium comprising processor readable instructions stored thereon, which, when executed on a processor-controlled metrology apparatus, cause the processor-controlled metrology apparatus to perform operations comprising:
  obtaining asymmetry information between opposite portions of a diffraction spectrum of a printed focus metrology pattern on a substrate, the asymmetry information being obtained, using a processor of the processor-controlled metrology apparatus, from a measurement signal generated by the metrology apparatus configured to optically inspect the printed focus metrology pattern comprising a first periodic array comprising:
    first and second pattern regions, each comprising a repeating arrangement of:
      a first feature comprising a main body and sub-features projecting from the main body; and
      a second feature disposed adjacent to the first feature, wherein a distance between the first and second features is smaller than an optical resolution of the metrology apparatus, and wherein the first and second features and sub-features of the first pattern region are structured same as the first and second features and sub-features of the second pattern region; and
    a space region having no features disposed between the first and second pattern regions, wherein a width of the space region is greater than a separation between successive ones of the repeating arrangement of the first or second pattern regions,
  wherein the asymmetry information is based on:
    an asymmetry of the first and second features;
    the first and second features and sub-features of the first pattern region being structured same as the first and second features and sub-features of the second pattern region; and
    the width of the space region being greater than the separation between successive ones of the repeating arrangement of the first or second pattern regions; and
  deriving a measurement of focus performance based on the asymmetry information.

14. The method of claim 1, further comprising:
  manufacturing devices wherein a device pattern is applied to a series of substrates using the lithographic process; and
  controlling the lithographic process based on the measured focus performance.

15. A lithographic cell comprising the lithographic system of claim 11.

* * * * *